(12) United States Patent
Becker et al.

(10) Patent No.: US 10,600,611 B2
(45) Date of Patent: Mar. 24, 2020

(54) ION SOURCE CRUCIBLE FOR SOLID FEED MATERIALS

(71) Applicant: APPLIED Materials, Inc., Santa Clara, CA (US)

(72) Inventors: Klaus Becker, Kensington, NH (US); Daniel Alvarado, Methuen, MA (US); Michael St. Peter, Gloucester, MA (US); Graham Wright, Newburyport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/190,649

(22) Filed: Nov. 14, 2018

(65) Prior Publication Data
US 2019/0180971 A1 Jun. 13, 2019

Related U.S. Application Data

(60) Provisional application No. 62/597,736, filed on Dec. 12, 2017.

(51) Int. Cl.
H01J 37/08 (2006.01)
H01J 37/34 (2006.01)
H01J 37/32 (2006.01)

(52) U.S. Cl.
CPC ........ *H01J 37/08* (2013.01); *H01J 37/32055* (2013.01); *H01J 37/3417* (2013.01);
(Continued)

(58) Field of Classification Search
CPC ...... H01J 37/08; H01J 2237/081; H01J 27/02; H01J 27/08; H01J 37/3171; H01J 37/3434;
(Continued)

(56) References Cited

U.S. PATENT DOCUMENTS 3,404,084 A * 10/1968 Hamilton ................ C23C 14/30
204/298.05
5,089,746 A * 2/1992 Rosenblum ............. H01J 37/08
204/298.01
(Continued)

FOREIGN PATENT DOCUMENTS

JP 05054809 A * 3/1993
KR 10-0793366 B1 1/2008
(Continued)

OTHER PUBLICATIONS

International Search Report and Written Opinion dated Mar. 5, 2019 in corresponding PCT application No. PCT/US2018/061000.
(Continued)

*Primary Examiner* — Wyatt A Stoffa
(74) *Attorney, Agent, or Firm* — Nields, Lemack & Frame, LLC

(57) ABSTRACT

An ion source with a crucible is disclosed. In some embodiments, the crucible is disposed in one of the ends of the ions source, opposite the cathode. In other embodiments, the crucible is disposed in one of the side walls. A feed material, which may be in solid form is disposed in the crucible. In certain embodiments, the feed material is sputtered by ions and electrons in the plasma. In other embodiments, the feed material is heated so that it vaporizes. The ion source may be oriented so that the crucible is disposed in the lowest wall so that gravity retains the feed material in the crucible.

21 Claims, 4 Drawing Sheets

(52) U.S. Cl.
CPC ...... *H01J 37/3435* (2013.01); *H01J 37/3438* (2013.01); *H01J 2237/081* (2013.01)

(58) Field of Classification Search
CPC ............... H01J 37/3438; H01J 37/3417; H01J 37/32055
See application file for complete search history.

(56) References Cited

U.S. PATENT DOCUMENTS

| | | | | |
|---|---|---|---|---|
| 5,180,477 | A * | 1/1993 | Ito | C23C 14/221 118/723 VE |
| 6,768,121 | B2 * | 7/2004 | Horsky | H01J 27/12 250/427 |
| 8,324,592 | B2 * | 12/2012 | Ryding | H01J 27/04 250/423 R |
| 8,759,788 | B1 * | 6/2014 | Bassom | H01J 37/08 250/423 R |
| 9,396,902 | B2 * | 7/2016 | Biloiu | H01J 37/08 |
| 2002/0130270 | A1 * | 9/2002 | Reyes | H01J 37/08 250/423 R |
| 2006/0163489 | A1 * | 7/2006 | Low | H01J 27/08 250/426 |
| 2009/0289197 | A1 * | 11/2009 | Slocum | H01J 27/08 250/424 |
| 2010/0148088 | A1 | 6/2010 | Radovanov et al. | |
| 2012/0048723 | A1 * | 3/2012 | Chaney | H01J 37/08 204/192.11 |
| 2012/0255490 | A1 * | 10/2012 | Tanjo | H01J 37/08 118/638 |
| 2013/0072008 | A1 * | 3/2013 | Perel | C23C 14/48 438/514 |
| 2013/0260544 | A1 * | 10/2013 | Koo | C23C 14/48 438/527 |
| 2013/0313971 | A1 * | 11/2013 | Biloiu | H01J 37/08 315/111.21 |
| 2014/0319369 | A1 * | 10/2014 | Koo | H01J 27/02 250/424 |
| 2015/0034837 | A1 * | 2/2015 | Koo | H01J 27/022 250/424 |
| 2017/0140898 | A1 * | 5/2017 | Kawaguchi | H01J 37/32614 |
| 2017/0247789 | A1 | 8/2017 | Yarmolich | |

FOREIGN PATENT DOCUMENTS

| | | |
|---|---|---|
| WO | 2014/179585 A1 | 11/2004 |
| WO | 2015/017635 A1 | 2/2015 |

OTHER PUBLICATIONS

International Search Report and Written Opinion dated Nov. 19, 2019 in co-pending PCT application No. PCT/US2019/045052.

* cited by examiner

ION SOURCE CRUCIBLE FOR SOLID FEED MATERIALS

FIELD

Embodiments of the present disclosure relate to an ion source, and more particularly, an ion source with a crucible for solid feed materials.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller is typically disposed on the end of the arc chamber opposite the cathode. The cathode and repeller may be biased so as to repel the electrons, directing them back toward the center of the arc chamber. In some embodiments, a magnetic field is used to further confine the electrons within the arc chamber.

In certain embodiments, electrodes are also disposed on one or more side walls of the arc chamber. These electrodes may be positively or negatively biased so as to control the position of ions and electrons, so as to increase the ion density near the center of the arc chamber. An extraction aperture is disposed along another side, proximate the center of the arc chamber, through which the ions may be extracted.

In certain embodiments, it may be desirable to utilize a feed material that is in solid form as a dopant species. However, there are issues associated with using solid feed materials with IHC ion sources. For example, vaporizers used with ion sources are difficult to operate at temperatures greater than 1200 Celsius. Further, there may be issues with heat shielding and condensation in the tubes that connect the vaporizer with the arc chamber. These issues may prevent the use of many solids in a vaporizer because their vapor pressure is too low at 1200 Celsius.

Therefore, an ion source that may be used with a solid feed material without these limitations would be beneficial. Further, it would be advantageous if the ion source was not contaminated by the solid feed material.

SUMMARY

An ion source with a crucible is disclosed. In some embodiments, the crucible is disposed in one of the ends of the ions source, opposite the cathode. In other embodiments, the crucible is disposed in one of the side walls. A feed material, which may be in solid form is disposed in the crucible. In certain embodiments, the feed material is sputtered by ions and electrons in the plasma. In other embodiments, the feed material is heated so that it vaporizes. The ion source may be oriented so that the crucible is disposed in the lowest wall so that gravity retains the feed material in the crucible.

According to one embodiment, an indirectly heated cathode (IHC) ion source is disclosed. The IHC ion source comprises an arc chamber, comprising a plurality of electrically conductive side walls connecting a first end and a second end; an indirectly heated cathode disposed on the first end of the arc chamber; and a crucible disposed on the second end of the arc chamber. In certain embodiments, the ion source comprises an electrode disposed on one of the plurality of electrically conductive side walls; wherein a voltage is applied to the electrode relative to the voltage applied to the plurality of electrically conductive side walls of the arc chamber. In some embodiments, a feed material is disposed in the crucible, wherein the arc chamber is oriented so that gravity retains the feed material in the crucible. In certain embodiments, crucible comprises a target holder having a recessed cavity into which a feed material is disposed. In certain embodiments, the crucible comprises a heated crucible, having a recessed cavity in which a feed material is disposed and heated. In some embodiments, a cover having a small opening is disposed on a top of the recessed cavity. In certain embodiments, a filament is used to heat the feed material.

According to another embodiment, an indirectly heated cathode (IHC) ion source is disclosed. The IHC ion source comprises an arc chamber, comprising a plurality of electrically conductive side walls connecting a first end and a second end; an indirectly heated cathode disposed on the first end of the arc chamber; and a crucible disposed on a second side wall, opposite a first side wall. In certain embodiments, the ion source comprises an electrode disposed on the first side wall; wherein a voltage is applied to the electrode relative to the voltage applied to the plurality of electrically conductive side walls of the arc chamber. In some embodiments, a feed material is disposed in the crucible, wherein the arc chamber is oriented so that gravity retains the feed material in the crucible. In certain embodiments, crucible comprises a target holder having a recessed cavity into which a feed material is disposed. In certain embodiments, the crucible comprises a heated crucible, having a recessed cavity in which a feed material is disposed and heated. In some embodiments, a cover having a small opening is disposed on a top of the recessed cavity. In certain embodiments, a filament is used to heat the feed material. In certain embodiments, a second crucible is disposed on the second side wall.

According to another embodiment, an ion source is disclosed. The ion source comprises an arc chamber, having a plurality of walls in which a plasma is generated; and a crucible disposed on one of the plurality of walls, to hold a feed material; wherein the arc chamber is oriented so that gravity retains the feed material in the crucible. In certain embodiments, the crucible comprises a target holder having a recessed cavity into which a feed material is disposed. In certain embodiments, the crucible comprises a heated crucible, having a recessed cavity in which a feed material is disposed and heated. In some embodiments, a filament is used to heat the feed material. In certain embodiments, the plasma is generated using an indirectly heated cathode or a RF ion source.

BRIEF DESCRIPTION OF THE FIGURES

For a better understanding of the present disclosure, reference is made to the accompanying drawings, which are incorporated herein by reference and in which.

DETAILED DESCRIPTION

As described above, vaporizers may be problematic at very high temperatures due to condensation and low vapor pressure.

Figure 1:
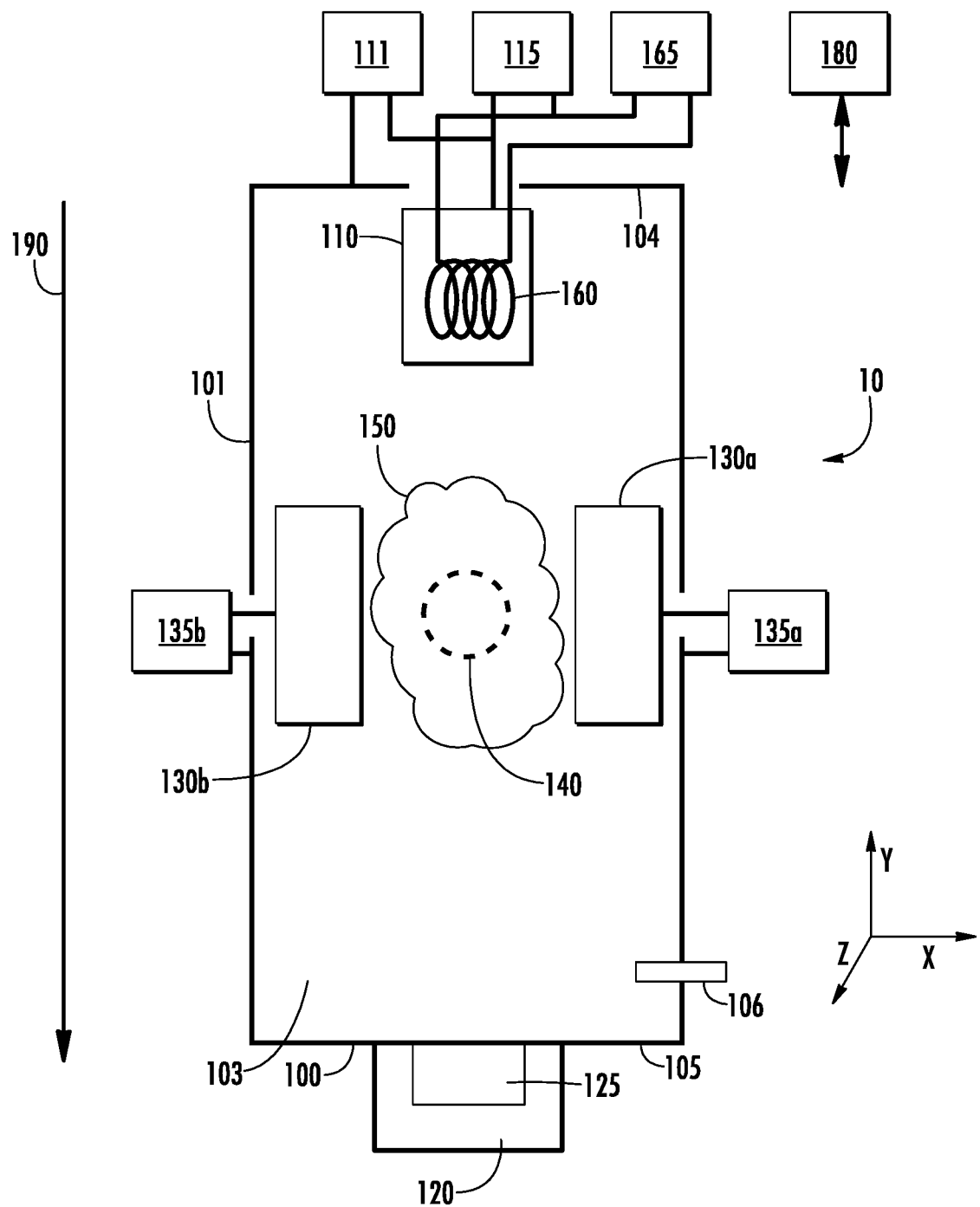
FIG. 1 is an indirectly heated cathode (IHC) ion source with a crucible in accordance with one embodiment.

FIG. 1 shows an IHC ion source 10 with a crucible that overcomes these issues. The IHC ion source 10 includes an arc chamber 100, comprising two opposite ends, and side walls 101 connecting to these ends. The arc chamber 100 also includes a bottom wall and a top wall. The walls of the arc chamber 100 may be constructed of an electrically conductive material and may be in electrical communication with one another. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be biased relative to the arc chamber 100, such as by bias power supply 111. In other embodiments, the cathode 110 may be electrically connected to the arc chamber 100, so as to be at the same voltage as the side walls of the arc chamber 100. In these embodiments, bias power supply 111 may not be employed and the cathode 110 may be electrically connected to the side walls of the arc chamber 100. In certain embodiments, the arc chamber 100 is connected to electrical ground.

In this embodiment, a crucible 120 is disposed in the arc chamber 100 on the second end 105 of the arc chamber 100 opposite the cathode 110. The crucible 120 may be made from an electrically conductive material and may be electrically connected to the side walls of the arc chamber 100.

In certain embodiments, a magnetic field 190 is generated in the arc chamber 100. This magnetic field is intended to confine the electrons along one direction. The magnetic field 190 typically runs parallel to the side walls 101 from the first end 104 to the second end 105. For example, electrons may be confined in a column that is parallel to the direction from the cathode 110 to the crucible 120 (i.e. the y direction). Thus, electrons do not experience any electromagnetic force to move in the y direction. However, movement of the electrons in other directions may experience an electromagnetic force.

In the embodiment shown in FIG. 1, first electrode 130a and second electrode 130b may be disposed on respective opposite side walls 101 of the arc chamber 100, such that the first electrode 130a and the second electrode 130b are within the arc chamber 100. The first electrode 130a and the second electrode 130b may be configured so as to be electrically isolated from the side walls 101. The first electrode 130a and the second electrode 130b may each be biased by a respective power supply. In certain embodiments, the first electrode 130a and the second electrode 130b may be in communication with a common power supply. However, in other embodiments, to allow maximum flexibility and ability to tune the output of the IHC ion source 10, the first electrode 130a may be in communication with a first electrode power supply 135a and the second electrode 130b may be in communication with a second electrode power supply 135b.

The first electrode power supply 135a and the second electrode power supply 135b serve to bias the first electrode 130a and the second electrode 130b, respectively, relative to the side walls of the arc chamber 100. In certain embodiments, the first electrode power supply 135a and the second electrode power supply 135b may bias the first electrode 130a and the second electrode 130b positively or negatively relative to the side walls 101 of the arc chamber 100. In certain embodiments, at least one of the electrodes may be biased at between 40 and 500 volts relative to the side walls 101 of the arc chamber 100.

Each of the cathode 110, the crucible 120 and the electrodes are made of an electrically conductive material, such as a metal or graphite.

Disposed on another side of the arc chamber 100, referred to as the top wall 103, may be an extraction aperture 140. In FIG. 1, the extraction aperture 140 is disposed on a side that is parallel to the X-Y plane (parallel to the page). Further, the IHC ion source 10 also comprises a gas inlet 106 through which the gas to be ionized is introduced to the arc chamber 100.

A controller 180 may be in communication with one or more of the power supplies such that the voltage or current supplied by these power supplies may be modified. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

A feed material 125, such as indium, aluminum, antimony or gallium, may be disposed within the crucible 120. The feed material 125 may be in the form of a solid when placed in the crucible 120. However, in certain embodiments, the feed material 125 may melt and become a liquid. Therefore, in certain embodiments, the ion source 10 is configured such that the crucible 120 is located on the lowest side (i.e. the side closest to ground) so that melted feed material does not flow from the crucible 120 into the arc chamber 100, but rather remains in the crucible 120. In other words, the ion source 10 is oriented such that the feed material 125 is retained in the crucible 120 by gravity.

During operation, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the arc chamber 100. These electrons collide with the molecules of gas that are fed into the arc chamber 100 through the gas inlet 106. A carrier gas, such as argon, or an etching gas, such as fluorine, may be introduced into the arc chamber 100 through a suitably located gas inlet 106. The combination of electrons from the cathode 110, the gas and the positive potential creates plasma 150. The plasma 150 may be confined and manipulated by the electrical fields created the first electrode 130a and the second electrode 130b. Further, in certain embodiments, the electrons and positive ions may be somewhat confined by the magnetic field 190. In certain embodiments, the plasma 150 is confined near the center of the arc chamber 100, proximate the extraction aperture 140. In some embodiments, the plasma 150 may be biased at a voltage which is close to the average of the voltages applied to the first electrode 130a and the second electrode 130b. Chemical etching or sputtering by plasma 150 transforms feed material 125 into the gas phase and causes ionization. The ionized feed material can then be extracted through the extraction aperture 140 and used to prepare an ion beam.

In certain embodiments, the voltage of the cathode 110 is less positive than the voltage of the plasma 150. For example, in one embodiment, the cathode 110 may be at the same voltage as the side walls of the arc chamber 100. The first electrode 130a may be biased at 150V, while the second electrode 130b may be biased at 0V or 20V. Thus, the electrons generated by the cathode 110 are attracted toward the plasma 150. In some embodiments, these emitted electrons or other particles may also strike the feed material 125, causing it to sputter.

Negative ions and neutral atoms that are sputtered or otherwise released from the feed material 125 are attracted toward the plasma 150, since the plasma 150 is maintained at a more positive voltage than the crucible 120.

While FIG. 1 shows two electrodes, it is understood that one of these electrodes, such as second electrode 130b and its associated second electrode power supply 135b may be eliminated in some embodiments. In another embodiment, the second electrode 130b is disposed within the arc chamber 100, but is electrically connected to the side walls 101 of the arc chamber 100. Thus, in this embodiment, the second electrode power supply 135b may be eliminated.

Figure 2:
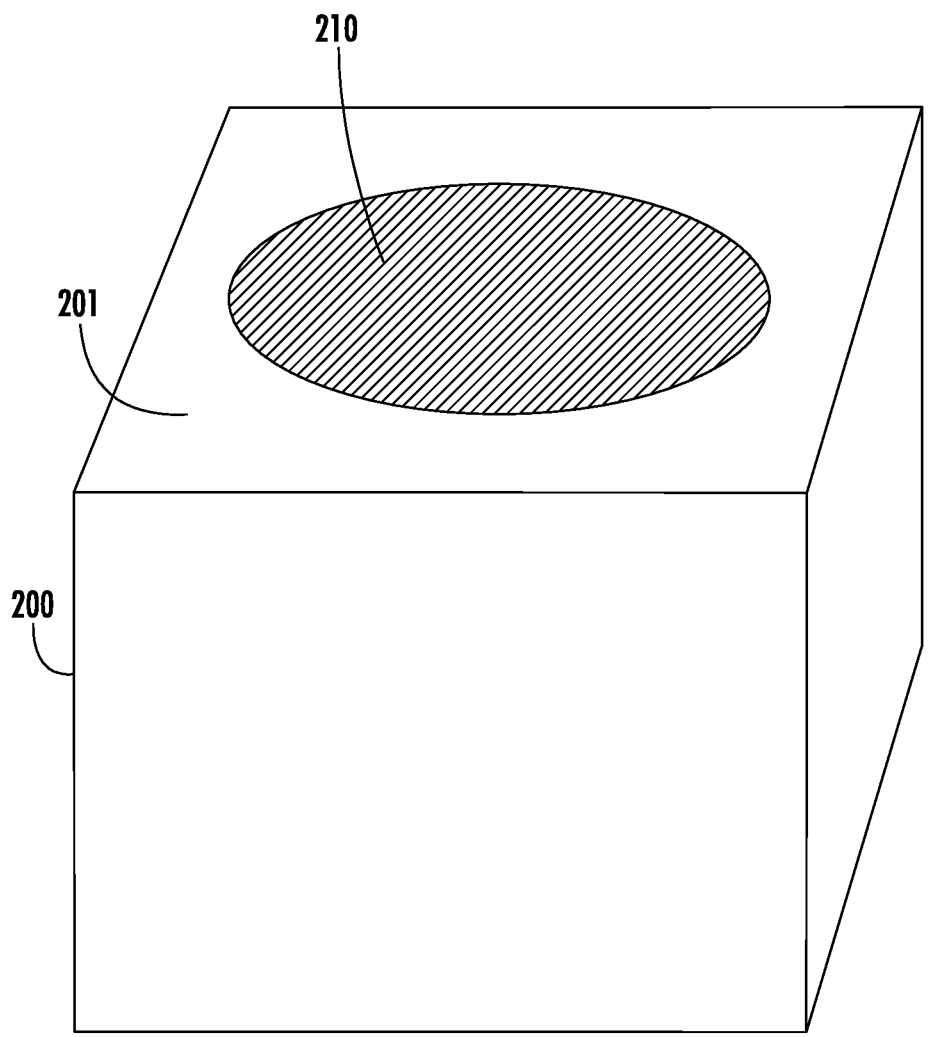
FIG. 2 is a crucible in accordance with one embodiment.

FIG. 2 shows a first embodiment of a crucible. In this embodiment, the crucible comprises a target holder 200. The target holder 200 includes a recessed cavity 210, into which the feed material may be disposed. The recessed cavity 210 is disposed on the top surface 201, which is in communication with the interior of the arc chamber 100 when the target holder 200 is attached to the arc chamber 100. The target holder 200 is made of an electrically conductive material, such as graphite, tungsten or tantalum. Further, the target holder 200 is electrically and mechanically connected to the side walls 101 of the arc chamber 100.

When the target holder 200 of FIG. 2 is employed with an arc chamber 100, the feed material 125 is transferred into the arc chamber 100 through the act of sputtering or chemical etching driven by the electrons and ions in the plasma 150. There are no other sources of electrical bias or heat being applied to the feed material 125.

Figure 3:
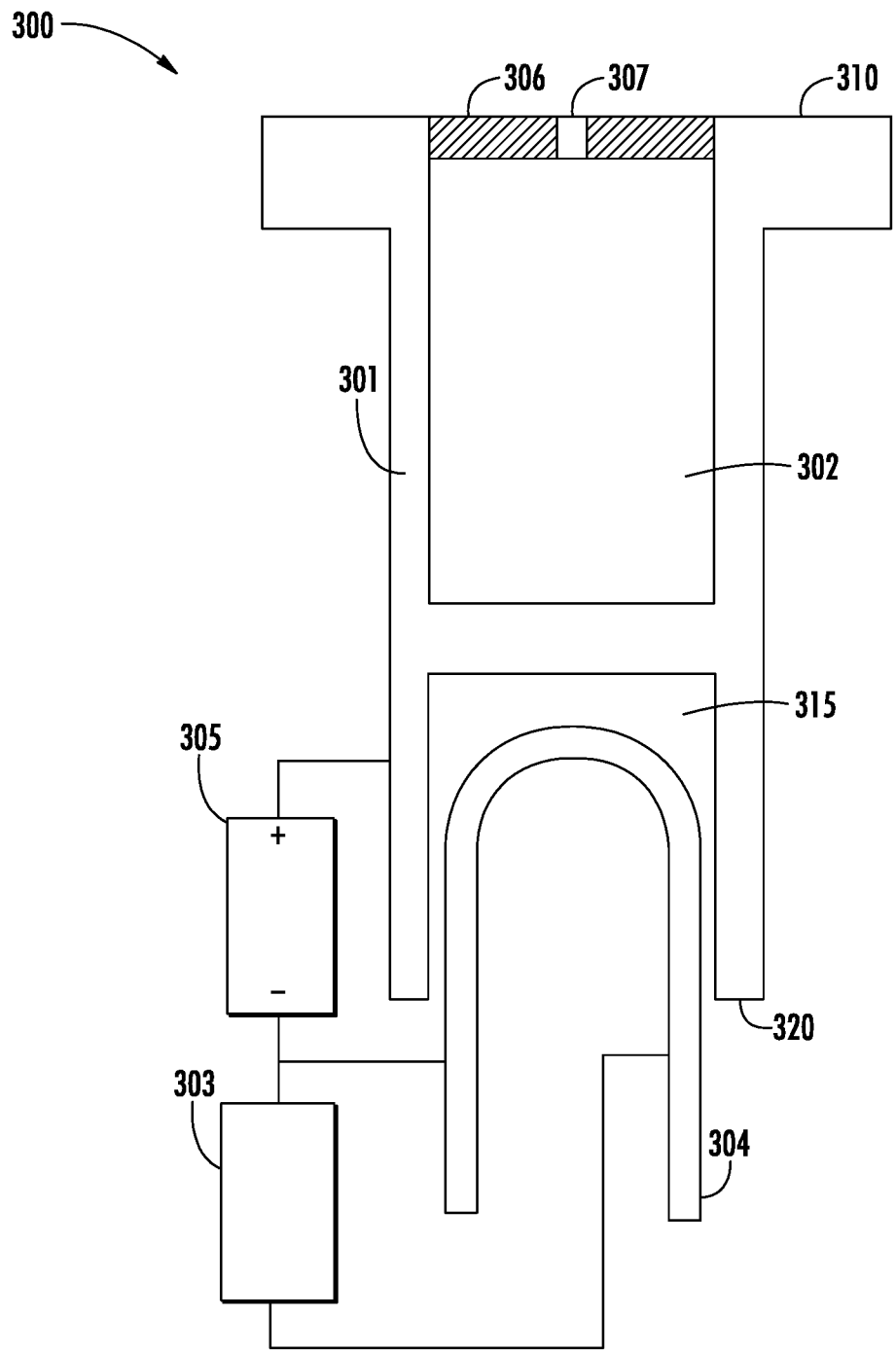
FIG. 3 is a crucible in accordance with another embodiment.

FIG. 3 shows a second embodiment of a crucible. In this embodiment, the crucible is a heated crucible 300. The heated crucible 300 comprises a target body 301, having a recessed cavity 302 on its first surface 310. The recessed cavity 302 is used to hold the feed material 125. The target body 301 may be an electrical conductive material such as graphite, tungsten or tantalum.

A target filament 304 is disposed in a second cavity 315, typically on a second surface 320, opposite the first surface 310. The target filament 304 is in communication with a target filament power supply 303. The target filament power supply 303 is configured to pass a current through the target filament 304, such that the target filament 304 emits thermionic electrons. Target bias power supply 305 biases target filament 304 negatively relative to the target body 301, so these thermionic electrons are accelerated from the target filament 304 toward the target body 301 and heat the target body 301 when they strike the interior surface of the second cavity 315 of target body 301. The target bias power supply 305 may bias the target filament 304 so that it has a voltage that is between, for example, 200V to 1500V more negative than the voltage of the target body 301. The target body 301 may be heated to a temperature such that the feed material is vaporized. In certain embodiments, the voltage applied by target bias power supply 305 may be adjustable so as to control a temperature of the target body 301.

Thus, the target filament power supply 303 supplies a current to the target filament 304. The target bias power supply 305 biases the target filament 304 so that it is more negative than the target body 301, so that electrons are attracted toward the target body 301 from the target filament 304. In certain embodiments, the target body 301 may be electrically connected to the arc chamber 100, so as to be at the same voltage as the side walls of the arc chamber 100. The electrons heat the target body 301, which heats the feed material 125 until it reaches sufficient vapor pressure to generate a plasma. A heated crucible 300 may be used to evaporate solids directly at high temperature. This may be utilized when a carrier gas is undesirable or no suitable carrier gas is available.

The heated crucible 300 shown in FIG. 3 does not rely on sputtering. Therefore, a cover 306 with a small opening 307 may be placed over the recessed cavity 302 to isolate the feed material 125 from the plasma 150. In certain embodiments, the opening may be dimensioned so as to avoid rapid depletion of the feed material 125 from the heated crucible 300. In certain embodiments, the dimension of the opening be less than 25% of the maximum internal dimension of the crucible. The cover 306 may be constructed of the same material as the target body 301, or may be graphite regardless of the material used for the target body 301. The use of a cover 306 reduces contamination of plasma 150 with feed material 125 if the heated crucible 300 is not in use. Therefore, the ion source 10 may still be used for multiple feed materials instead of being dedicated to only one feed material.

Further, although the target body 301 is biased relative to the target filament 304, the target body 301 is not biased relative to the walls of the ion source 10. There are no other sources of electrical bias being applied to the feed material 125.

The ion source 10 of FIG. 1 may be utilized with the target holder 200 of FIG. 2 or the heated crucible 300 of FIG. 3. In both embodiments, it is preferably that the crucible be mounted on the side so that gravity retains the feed material in the crucible, as shown in FIG. 1. In certain embodiments, the top surface of the target holder 200 may be flush with the second end 105, as shown in FIG. 1. In other embodiments, the target holder 200 may simply rest on the second end 105. Similarly, in certain embodiments, the top surface of the heated crucible 300 may be flush with the second end 105. In other embodiments, the heated crucible 300 may simply rest on the second end 105.

Note that in this embodiment, the crucible 120 is disposed on the end of the arc chamber 100 where a repeller traditionally would be installed. Further, no repeller is used in this embodiment.

During one test, the target holder 200 of FIG. 2 was used to create an ion beam containing indium. Solid indium was disposed in the target holder 200 and the ion source 10 was actuated. The indium melted, but did not contaminate the ion source 10. In other words, the liquid indium remains within the crucible 120. During a second test, the target holder 200 of FIG. 2 has created to hold an aluminum feed material. Again, the aluminum melted, but did not contaminated the ion source 10.

Figure 4:
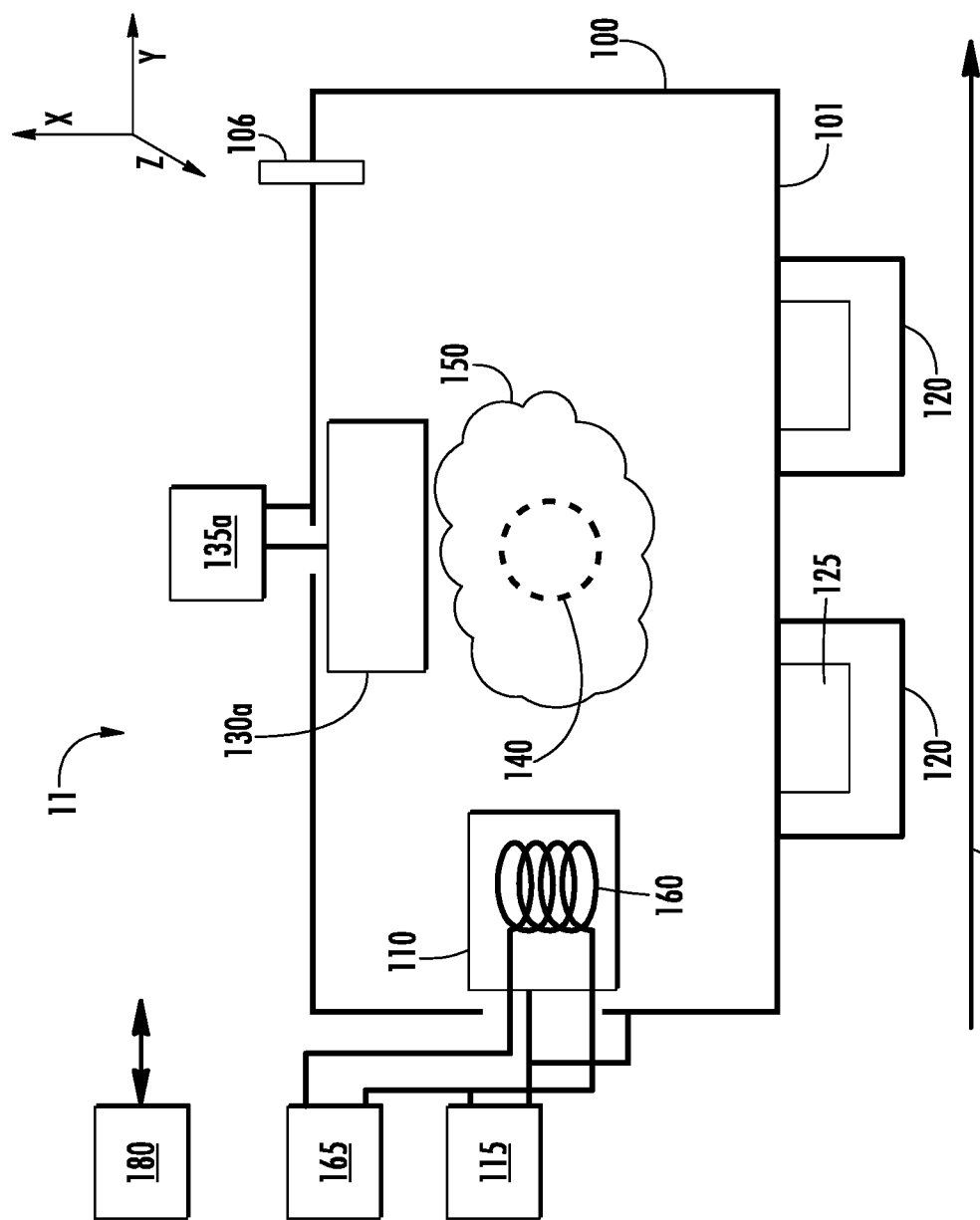
FIG. 4 is an indirectly heated cathode (IHC) ion source with a crucible in accordance with another embodiment.

FIG. 1 shows an embodiment of an IHC ion source 10 where the cathode 110 is electrically connected to the arc chamber 100, while the first electrode 130a and the second electrode 130b are individually biased relative to the arc chamber 100 using first electrode power supply 135a and second electrode power supply 135b, respectively. FIG. 4 shows an IHC ion source 11 according to another embodiment. Similar components have been given identical reference designators. In this embodiment, the IHC ion source 11 has the cathode 110 electrically connected to the arc chamber 100. However, it is understood that bias power supply 111 may be used to bias the cathode 110 relative to the side walls 101 of the arc chamber 100. Further, the second electrode 130b has been eliminated. A magnetic field 190 may also be employed.

In this embodiment, only first electrode 130a is biased relative to the arc chamber 100. The first electrode 130a may be positively biased at between 40 and 500 volts relative to the arc chamber 100 using first electrode power supply 135a. Further, the arc chamber 100 has been rotated such that one of the side walls 101 is the closest to ground. Specifically, the side wall opposite the first electrode 130a is the closest to ground.

In this embodiment, the crucible 120 is disposed on the side wall opposite the first electrode 130a. Further, in certain embodiments, this side wall may be of a length that is sufficient to support a plurality of crucibles 120, as shown in FIG. 4. For example, two or more crucibles 120 may be installed along this side wall. Either of the crucibles shown in FIG. 2 and FIG. 3 may be employed in this embodiment. In certain embodiments, the top surface of the target holder 200 may be flush with the side wall 101, as shown in FIG. 4. In other embodiments, the target holder 200 may simply rest on the side wall 101. Similarly, in certain embodiments, the top surface of the heated crucible 300 may be flush with the side wall 101. In other embodiments, the heated crucible 300 may simply rest on the side wall 101.

If a plurality of target holders 200 of FIG. 2 are employed, it may be preferable that all target holders 200 contain the same feed material to prevent contamination. The use of multiple target holders 200 may increase the concentration of solid material in the plasma 150. Thus, a higher beam current of desired ions may be possible by using multiple crucibles.

If a plurality of heated crucibles 300 of FIG. 3 are employed, it is possible to dispose different feed material in each of the heated crucibles 300. For example, two heated crucibles 300 may be filled with different feed materials. When the first feed material is to be used, the target filament 304 of the first heated crucible 300 is actuated, while the target filament 304 of the second heated crucible is disabled. In this way, vapor from the first heated crucible may enter the arc chamber 100, but no feed material from the second heated crucible enters the arc chamber 100. At a later time, the IHC ion source 11 may then create an ion beam using the feed material from the second heated crucible 300 by actuating the target filament 304 in the second heated crucible and disabling the target filament in the first heated crucible.

FIGS. 1 and 4 show specific embodiments which illustrate that the crucible 120 may be placed on a side of the arc chamber 100 that is different than the sides where the cathode 110 and first electrode 130a are disposed.

While the above disclosure describes the use of a crucible with an indirectly heated cathode ion source, it is understood that the disclosure is not limited to this embodiment. The ion source may be any type of ion source, such as an RF ion source, a Bernas ion source or any other type.

Further, in certain embodiments, the embodiment shown in FIG. 4 may be used in conjunction with a repeller. In certain embodiments, the cathode of FIG. 4 may be positively biased relative to the side walls of the arc chamber. In one particular embodiment, the cathode is biased relative to the side walls using bias power supply 111, and there is a repeller. In this embodiment, the first electrode 130a and the first electrode power supply 135a may be eliminated.

The embodiments described above in the present application may have many advantages. First, the present system allows a solid feed material to be used as a dopant material without the issues associated with the prior art. Second, by placing the crucible on the wall closest to ground, the feed material is retained in the crucible, even when in liquid form. In this way, the ion source is not contaminated or damaged by the liquid form of the feed material. Third, the concentration of dopant in the ion beam may be much greater using this crucible as compared to conventional vaporizers. In one experiment, dopant concentration in the ion beam more than doubled as compared to a conventional vaporizer. Further, in certain embodiments, a plurality of crucibles can be disposed within a single arc chamber. This may allow high concentrations of feed material to be ionized. In other embodiments, this may allow different feed materials to be used with a single arc chamber without the need to change the crucibles.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An indirectly heated cathode ion source, comprising:
   an arc chamber, comprising a plurality of electrically conductive side walls connecting a first end and a second end;
   an indirectly heated cathode disposed on the first end of the arc chamber; and
   a crucible disposed on the second end of the arc chamber, wherein the crucible comprises a target holder having a recessed cavity into which a feed material is disposed.

2. The indirectly heated cathode ion source of claim 1, further comprising an electrode disposed on one of the plurality of electrically conductive side walls; wherein a voltage is applied to the electrode relative to a voltage applied to the plurality of electrically conductive side walls of the arc chamber.

3. The indirectly heated cathode ion source of claim 1, wherein the arc chamber is oriented so that gravity retains the feed material in the crucible.

4. The indirectly heated cathode ion source of claim 1, wherein the crucible comprises a heated crucible in which the feed material is heated.

5. The indirectly heated cathode ion source of claim 4, further comprising a cover having a small opening disposed on a top of the recessed cavity.

6. The indirectly heated cathode ion source of claim 4, wherein a filament is used to heat the feed material.

7. The ion source of claim 1, wherein a top surface of the crucible is flush with the second end.

8. The ion source of claim 1, wherein the crucible rests the second end.

9. An indirectly heated cathode ion source, comprising:
an arc chamber, comprising a plurality of electrically conductive side walls connecting a first end and a second end;
an indirectly heated cathode disposed on the first end of the arc chamber; and
a crucible disposed on a second side wall, opposite a first side wall, wherein the crucible comprises a target holder having a recessed cavity into which a feed material is disposed.

10. The indirectly heated cathode ion source of claim 9, further comprising an electrode disposed on the first side wall; wherein a voltage is applied to the electrode relative to a voltage applied to the plurality of electrically conductive side walls of the arc chamber.

11. The indirectly heated cathode ion source of claim 9, wherein the arc chamber is oriented so that gravity retains the feed material in the crucible.

12. The indirectly heated cathode ion source of claim 9, wherein the crucible comprises a heated crucible, in which the feed material is heated.

13. The indirectly heated cathode ion source of claim 12, wherein a filament is used to heat the feed material.

14. The indirectly heated cathode ion source of claim 9, further comprising a second crucible disposed on the second side wall.

15. The ion source of claim 9, wherein a top surface of the crucible is flush with the second side wall.

16. The ion source of claim 9, wherein the crucible rests on the second side wall.

17. An ion source, comprising:
an arc chamber, having a plurality of walls in which a plasma is generated; and
a crucible disposed on one of the plurality of walls, to hold a feed material;
wherein the arc chamber is oriented so that gravity retains the feed material in the crucible, wherein the crucible comprises a target holder having a recessed cavity into which the feed material is disposed and wherein a top surface of the crucible is flush with the one of the plurality of walls.

18. The ion source of claim 17, wherein the crucible comprises a heated crucible, in which the feed material is heated.

19. The ion source of claim 18, wherein a filament is used to heat the feed material.

20. The ion source of claim 17, wherein the plasma is generated using an indirectly heated cathode.

21. The ion source of claim 17, wherein the plasma is generated using an RF ion source.

\* \* \* \* \*